(12) United States Patent
Cheng et al.

(10) Patent No.: US 10,686,048 B2
(45) Date of Patent: Jun. 16, 2020

(54) VERTICAL FIN WITH A GATE STRUCTURE HAVING A MODIFIED GATE GEOMETRY

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/031,376

(22) Filed: Jul. 10, 2018

(65) Prior Publication Data
US 2018/0323271 A1 Nov. 8, 2018

Related U.S. Application Data

(63) Continuation of application No. 15/498,054, filed on Apr. 26, 2017, now Pat. No. 10,068,980.

(51) Int. Cl.
| | |
|---|---|
| *H01L 29/423* | (2006.01) |
| *H01L 29/66* | (2006.01) |
| *H01L 29/78* | (2006.01) |
| *H01L 21/02* | (2006.01) |
| *H01L 29/40* | (2006.01) |
| *H01L 29/49* | (2006.01) |

(52) U.S. Cl.
CPC .... *H01L 29/42376* (2013.01); *H01L 21/0217* (2013.01); *H01L 21/02164* (2013.01); *H01L 29/401* (2013.01); *H01L 29/6656* (2013.01); *H01L 29/66545* (2013.01); *H01L 29/66795* (2013.01); *H01L 29/785* (2013.01); *H01L 29/7843* (2013.01); *H01L 29/4966* (2013.01)

(58) Field of Classification Search
None
See application file for complete search history.

(56) References Cited

U.S. PATENT DOCUMENTS

| 7,129,140 B2 | 10/2006 | Chen et al. |
|---|---|---|
| 7,749,911 B2 | 7/2010 | Wu et al. |
| 8,338,258 B2 | 12/2012 | Guo et al. |

(Continued)

OTHER PUBLICATIONS

List of IBM Patents or Patent Applications Treated as Related dated Jul. 10, 2018, 2 pages.

(Continued)

*Primary Examiner* — Long Pham
(74) *Attorney, Agent, or Firm* — Tutunjian & Bitetto, P.C.; Vazken Alexanian

(57) ABSTRACT

A method of forming a gate structure with a modified gate geometry, including, forming two gate spacers and a dummy gate fill on a channel, wherein the dummy gate fill is between the two gate spacers, forming a stressed layer on the two gate spacers, wherein the stressed layer is on the surfaces of the gate spacers opposite the dummy gate fill, and wherein the stressed layer applies a tensile stress to the two gate spacers, and removing a portion of the dummy gate fill, wherein the tensile stress applied to the two gate spacers is no longer balanced by the dummy gate fill, such that each of the two gate spacers becomes inclined at an obtuse angle relative to a top surface of the remaining dummy gate fill.

9 Claims, 8 Drawing Sheets

(56) References Cited

U.S. PATENT DOCUMENTS

| | | | |
|---|---|---|---|
| 9,356,120 B2 * | 5/2016 | Wu | H01L 29/66545 |
| 2008/0296667 A1 | 12/2008 | Mikasa | |
| 2009/0283834 A1 | 11/2009 | Inokuma | |
| 2012/0223388 A1 | 9/2012 | Feustel et al. | |
| 2013/0198695 A1 | 8/2013 | Bryant et al. | |
| 2016/0056271 A1 | 2/2016 | Liaw | |
| 2016/0099337 A1 | 4/2016 | Cheng et al. | |

OTHER PUBLICATIONS

Anonymous, "Capping layer free damascene dummy gate formation for RMG finFET fabrication", IP.com. an IP.com Prior Art Database Technical Disclosure. Mar. 25, 2014. pp. 1-6.

* cited by examiner

VERTICAL FIN WITH A GATE STRUCTURE HAVING A MODIFIED GATE GEOMETRY

BACKGROUND

Technical Field

The present invention generally relates to forming gate structures for small critical dimension field effect transistors (FETs), and more particularly to adjusting gate dimensions and geometries during fabrication of FETs using stressed layers.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming a gate structure with a modified gate geometry is provided. The method includes forming two gate spacers and a dummy gate fill on a channel, wherein the dummy gate fill is between the two gate spacers. The method further includes forming a stressed layer on the two gate spacers, wherein the stressed layer is on the surfaces of the gate spacers opposite the dummy gate fill, and wherein the stressed layer applies a tensile stress to the two gate spacers. The method further includes removing a portion of the dummy gate fill, wherein the tensile stress applied to the two gate spacers is no longer balanced by the dummy gate fill, such that each of the two gate spacers becomes inclined at an obtuse angle relative to a top surface of the remaining dummy gate fill.

In accordance with another embodiment of the present invention, a method of forming a gate structure with a modified gate geometry is provided. The method includes forming two gate spacers and a dummy gate fill on a channel, wherein each of the two gate spacers has a thickness in the range of about 3 nm to about 15 nm, and wherein the dummy gate fill is between the two gate spacers. The method further includes forming a stressed layer on the two gate spacers, wherein the stressed layer is on the surfaces of the gate spacers opposite the dummy gate fill, and wherein the stressed layer is silicon oxide (SiO) or silicon nitride (SiN) that applies a tensile stress to the two gate spacers. The method further includes removing a portion of the dummy gate fill, wherein the tensile stress applied to the two gate spacers is no longer balanced by the dummy gate fill, such that each of the two gate spacers becomes inclined at an obtuse angle relative to a top surface of the remaining dummy gate fill.

In accordance with yet another embodiment of the present principles, a gate structure having a modified gate geometry is provided. The gate structure having a modified gate geometry includes a channel on a substrate, two gate spacers on the channel, a gate dielectric layer on the channel between the two gate spacers, a conductive gate fill on the gate dielectric layer between the two gate spacers, wherein the distance between the two gate spacers is $W_1$, and a stressed plug on the conductive gate fill.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
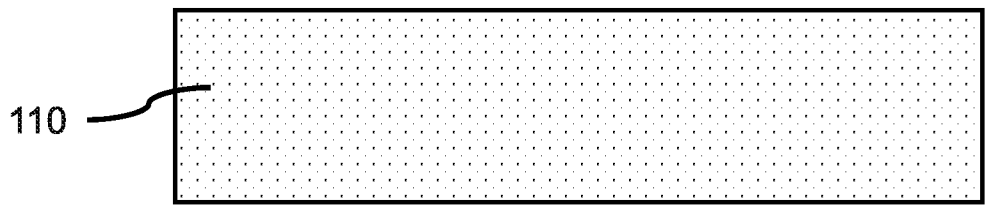
FIG. 1 is a cross-sectional side view showing a substrate, in accordance with an embodiment of the present invention.

Principles and embodiments of the present invention relate generally to forming gate structures on field effect transistors (FETs), including, but not limited to fin field effect transistors (FinFETs) and metal-oxide-semiconductor field effect transistors (MOSFETs), where the gate structure can be formed on a channel of the FET or FinFET and modified during the fabrication process to have a suitable geometry for creating the gate electrode without formation of void spaces.

Principles and embodiments of the present invention also relate generally to controlling the geometry of a gate structure through the application of stresses to the sidewalls of the gate structure, where the stresses cause the sidewalls to flex inwards or outwards at different stages in the gate structure fabrication process.

Principles and embodiments of the present invention also relate generally to forming a stressed layer on the outer sidewall surfaces of a gate spacer that applies a tensile stress to the sidewall surfaces of a gate spacer. The tensile stress on the outer sidewall surfaces of a gate spacer can be balanced, at least in part, by the dummy gate fill on the inner sidewall surfaces of the gate spacer.

Principles and embodiments of the present invention also relate generally to compensating for inwardly slanting gate spacers, and the reduced opening dimensions of a gate structure, where the top dimension is smaller than the bottom dimension, such that the formation of a gate electrode fill can be impeded by choking off the flow of precursors into the confined gate space. A tapered dummy gate structure profile can create difficulties for removing a dummy gate fill and forming a conductive gate electrode (e.g., metal gate fill). Canting gate spacers outward can provide a larger opening to remove a dummy gate fill and form a gate electrode.

Principles and embodiments of the present invention also relate generally to utilizing a tensilely stressed gate plug to pull the gate spacers back into an upright position after removal of the tensile stress on the outer sidewall surfaces of a gate spacer.

Exemplary applications/uses to which the present invention can be applied include, but are not limited to: fabrication of VT FET devices for logic circuits (e.g., NAND, NOR, XOR, etc.), high speed memory (e.g., SRAM), and application specific integrated circuits (ASICs).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), flowable chemical vapor deposition (FCVD), electron-beam physical vapor deposition (EB-PVD), and plasma-enhanced atomic layer deposition (PEALD). The depositions can be epitaxial processes, and the deposited material can be crystalline. Formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

While an embodiment of the present invention is illustrated as applied to a fin-type field effect transistor (FinFET), this is for illustrative purposes only, and is not intended to be a limitation on the scope of the present invention or the claims, except where expressly indicated. The present inventive concepts can be applied to other types of field effect transistors with other geometries, and these other FET types and geometries are intend to be included within the scope of the presently described and claimed invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG. 1, a cross-sectional side view of a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $Al_2O_3$, $SiO_2$, GaAs, SiC, Si:C, or SiGe. The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. Other semiconductor devices may already be formed on the substrate.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
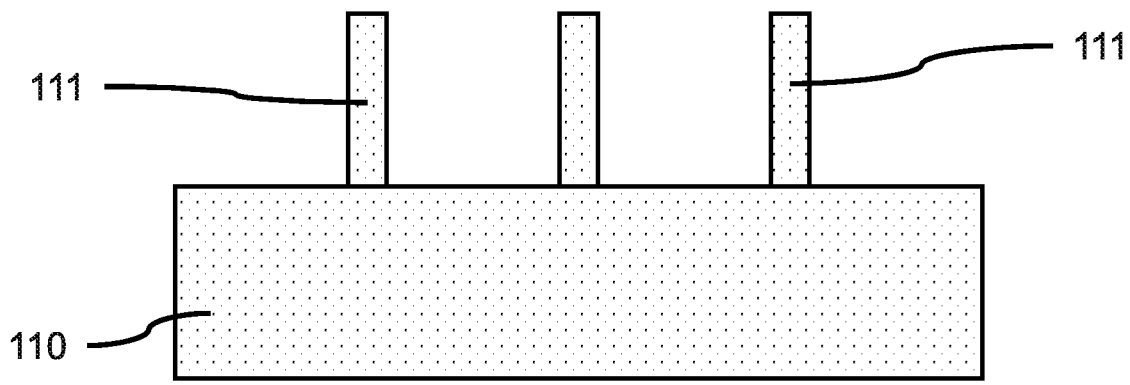
FIG. 2 is a cross-sectional side view showing a plurality of vertical fins on a substrate, in accordance with an embodiment of the present invention.

FIG. 2 is a cross-sectional side view showing a plurality of vertical fins on a substrate, in accordance with an embodiment of the present invention.

In one or more embodiments, one or more vertical fins 111 can be formed on the substrate 110. A vertical fin 11 can be formed by removing surrounding portions of the substrate 110, or by growing a vertical fin on a region of a substrate.

In various embodiments, a plurality of vertical fins 111 can be formed by a sidewall image transfer (SIT) process, self-aligned double patterning (SADP), or self-aligned quadruple patterning (SAQP) to provide a tight pitch between vertical fins. In various embodiments, a direct print can be used to provide fins. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch.

In one or more embodiments, the vertical fin can have a width in the range of about 5 nm to about 15 nm, or in the range of about 7 nm to about 10 nm, although other vertical fin widths are also contemplated. The vertical fin can form a channel of a fin field effect transistor (FinFET).

In other embodiments, a portion of the substrate can form a channel for a full deplete metal oxide semiconductor field effect transistor (FD-MOSFET), including on a semiconductor-on-insulator substrate (SeOI). The channel can be in the substrate 110.

In one or more embodiments, the vertical fin 111 can be the same material as the underlying substrate 110, or the vertical fin may be a different material, for example, silicon-germanium (SiGe), that can be hetero-epitaxially grown on a single crystal substrate 110.

Figure 3:
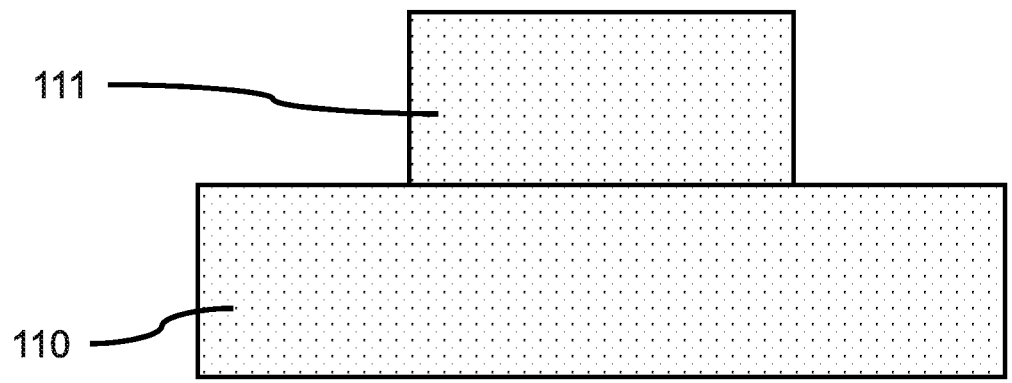
FIG. 3 is a cross-sectional side view showing the long axis of a vertical fin, in accordance with an embodiment of the present invention.

FIG. 3 is a cross-sectional side view showing the long axis of a vertical fin, in accordance with an embodiment of the present invention.

In one or more embodiments, the vertical fin 111 can have a length in the range of about 50 nm to about 150 nm, or in the range of about 70 nm to about 100 nm, although other vertical fin lengths are also contemplated.

Figure 4:
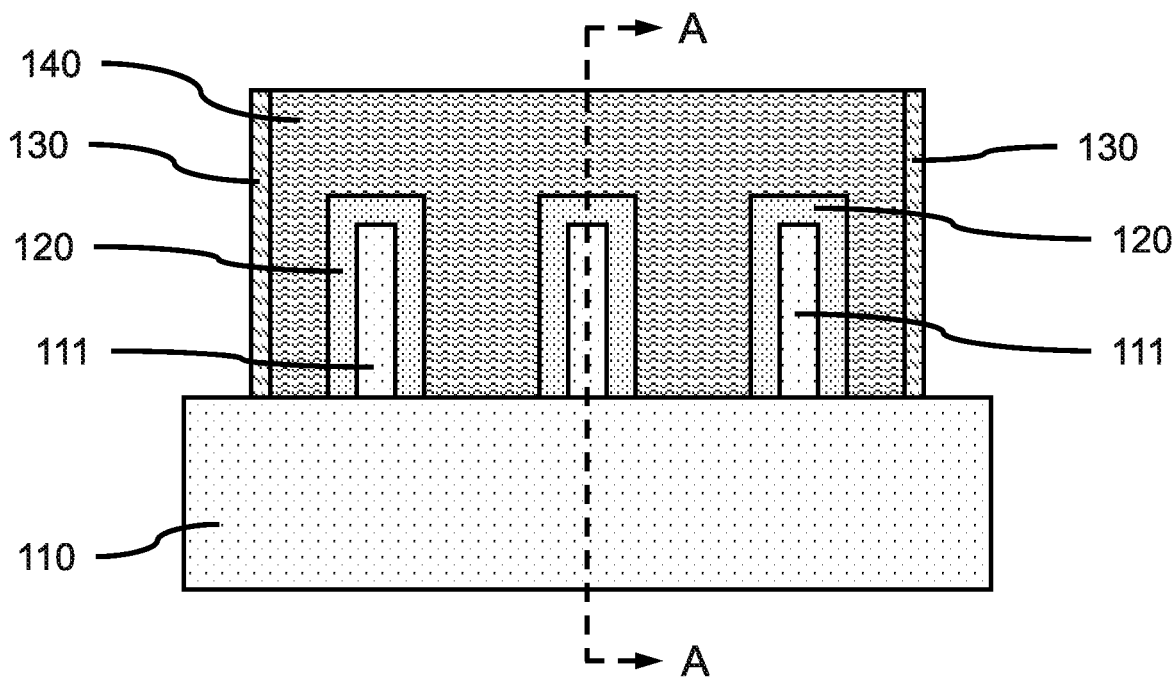
FIG. 4 is a cross-sectional side view showing a dummy gate structure across a plurality of vertical fins, in accordance with an embodiment of the present invention.

FIG. 4 is a cross-sectional side view showing a dummy gate structure across a plurality of vertical fins, in accordance with an embodiment of the present invention.

In one or more embodiments, a dummy gate structure can be formed on one or more vertical fins 111, where the dummy gate structure can include a gate dielectric layer 120, gate spacers 130, and a dummy gate fill 140.

In one or more embodiments, a gate dielectric layer 120 can be formed on one or more of the vertical fins 111, where the gate dielectric layer 120 can physically separate at least a portion of the vertical fin(s) 111 from a dummy gate fill 140, and physically and electrically separate the vertical fin(s) 111 from a subsequently formed gate electrode. In various embodiments, a portion of the gate dielectric layer 120 can be removed from the substrate 110 by an etch-back process, for example, by a selective, isotropic wet etch.

In one or more embodiments, a gate dielectric layer 120 can be formed on the exposed surfaces of the substrate and vertical fins 111 by a blanket deposition (e.g., CVD, PECVD) or conformally deposited (e.g., ALD, PEALD).

In one or more embodiments, the gate dielectric layer 120 can be an insulating dielectric layer, for example, a silicon oxide (SiO), silicon nitride (SiN), silicon oxynitride (SiON), a high-K dielectric, or a suitable combination of these materials.

In one or more embodiments, the gate dielectric layer 120 can have a thickness in the range of about 1 nm to about 4 nm, or can have a thickness in the range of about 1 nm to about 2 nm.

In one or more embodiments, a dummy gate fill 140 can be formed on the gate dielectric layer 120, vertical fins 111, and/or substrate 110.

In one or more embodiments, a dummy gate layer 140 can be formed on at least a portion of the vertical fins 111. In one or more embodiments, the dummy gate layer 140 can be formed by CVD, PECVD, PVD, a spin-on process, or combinations thereof, where the dummy gate layer 140 can be blanket deposited on the vertical fins 111 and substrate 110. Portions of the dummy gate fill 140 can be masked and removed to leave a predetermined portion across one or more vertical fins 111.

In one or more embodiments the dummy gate layer 140 can be a sacrificial material that can be easily and selectively patterned and etched. The dummy gate layer 140 can be amorphous silicon (a-Si), poly-silicon (p-Si), amorphous carbon (a-C), silicon-germanium (SiGe), an organic planarization layer (OPL), silicon oxide (SiO), silicon nitride (SiN), or suitable combinations thereof.

In one or more embodiments, a gate spacer 130 can be formed on the dummy gate fill 140, where the gate spacer 130 can be formed by a conformal deposition (e.g., ALD, PEALD). The gate spacer can cover the exposed sidewalls of the dummy gate fill, where the gate spacer 130 can surround the dummy gate fill 140 on four sides and cover a top surface of the dummy gate fill 140. The portion of the gate spacer 130 can be removed from the top surface of the dummy gate fill 140, for example, by a selective directional etch (e.g., reactive ion etch (RIE)), to expose the dummy gate fill 140, while leaving the gate spacer 130 covering the sides of the dummy gate fill.

In various embodiments, the gate spacer 130 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the gate spacer 130 may include one or more layers. In various embodiments, the gate spacer 130 can be stoichiometric silicon nitride ($Si_3N_4$).

In one or more embodiments, the gate spacer 130 can have a thickness in the range of about 3 nm to about 15 nm, or in the range of about 3 nm to about 10 nm.

Figure 5:
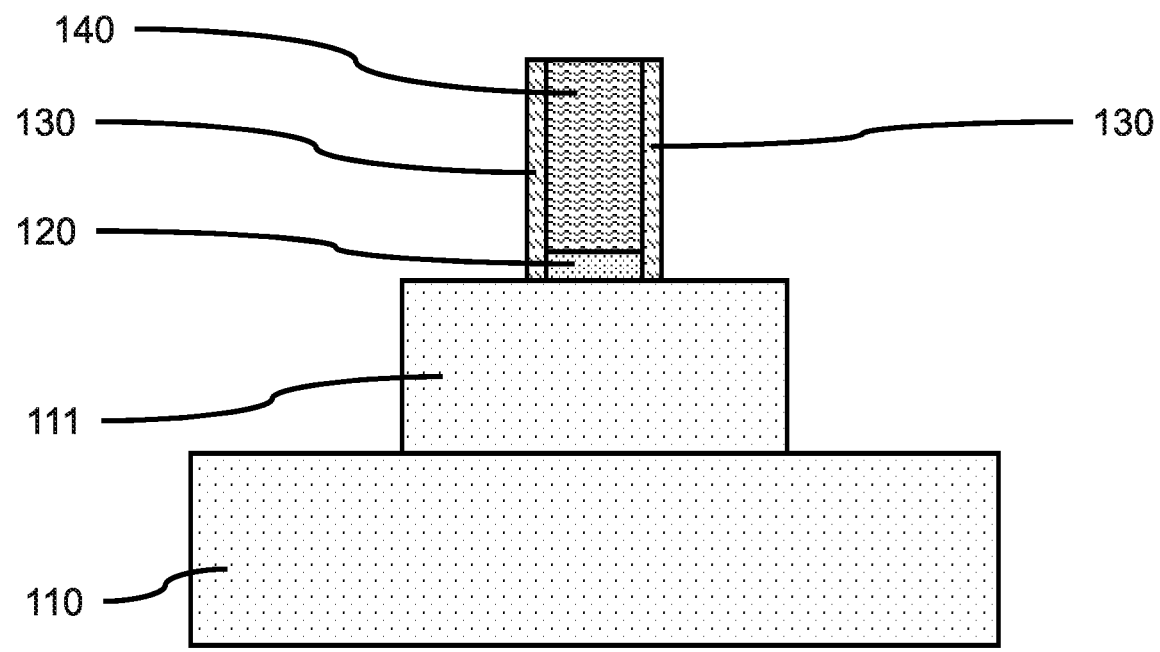
FIG. 5 is a cross-sectional side view showing the long axis of a vertical fin with a dummy gate structure on the vertical fin, in accordance with an embodiment of the present invention.

FIG. 5 is a cross-sectional side view along the AA cross-section of FIG. 4 showing the long axis of a vertical fin with a dummy gate structure on the vertical fin, in accordance with an embodiment of the present invention.

In one or more embodiments, the dummy gate structure can be on a portion of the top and side surfaces of a vertical fin 111, where the gate dielectric layer 120 covers a central portion of the vertical fin 111. The gate spacer 130 can extend away from the vertical fin 111, and the dummy gate fill 140 can be on the gate dielectric layer 120 and fill the space between the gate spacer 130.

Figure 6:
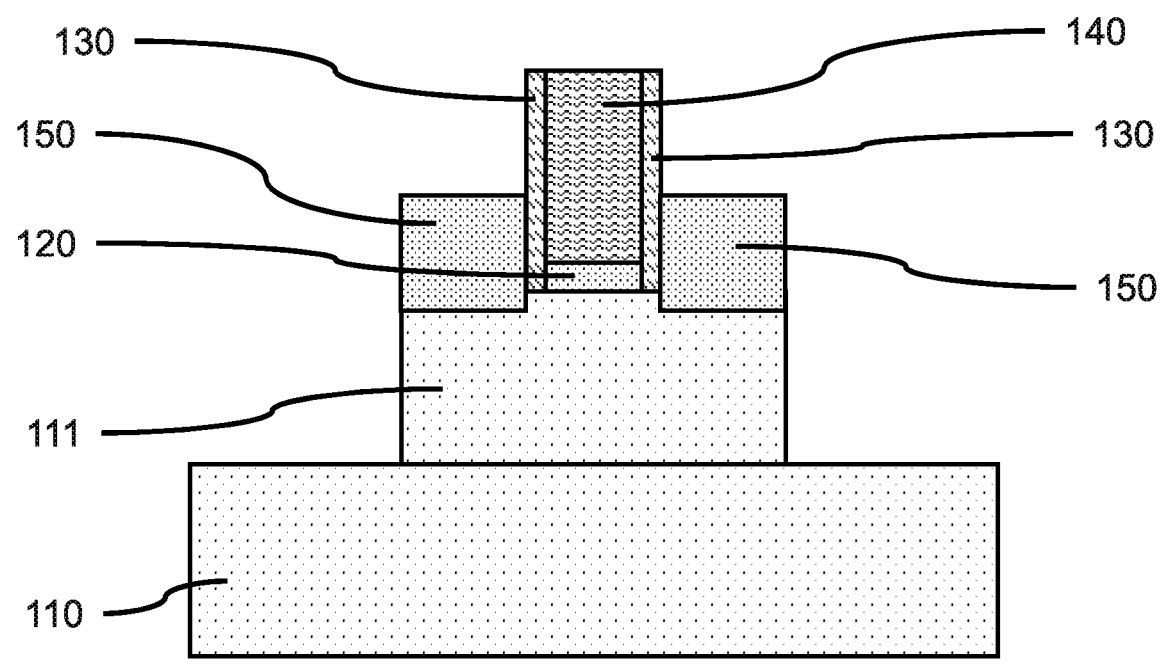
FIG. 6 is a cross-sectional side view showing the long axis of a vertical fin with source/drains formed on opposite sides of the dummy gate structure, in accordance with an embodiment of the present invention.

FIG. 6 is a cross-sectional side view showing the long axis of a vertical fin with source/drains formed on opposite sides of the dummy gate structure, in accordance with an embodiment of the present invention.

In one or more embodiments, a source/drain 150 can be formed on exposed surfaces of the vertical fin 111, where the source/drain 150 can be formed by epitaxially growing a source/drain 150 on the single-crystal surface of the vertical fin 111. A source/drain 150 can be formed on each of the opposite sides of a dummy gate structure, where the source/drains 150 can be on the sidewall of the gate spacer 130.

In various embodiments, the source/drain 150 can be grown by molecular beam epitaxy (MBE), vapor phase epitaxy (VPE), ion beam epitaxy (IBE), liquid-phase epitaxy (LPE), or combinations thereof. The source/drain 150 can be doped in situ (i.e., during epitaxial growth), or ex situ (i.e., after growing the layer expitaxially). In various embodiments, the source/drain 150 can have a different chemical composition than the substrate and/or vertical fin(s), for example, the source/drain 150 can be silicon-germanium (SiGe) and the vertical fin 111 can be silicon (Si).

In one or more embodiments, the source/drains 150 can be a doped layer that includes dopant species suitable to form an n-type source/drain 150 (e.g., phosphorus, arsenic, antimony), or dopant species suitable to form a p-type source/drain 150 (e.g., boron, gallium, indium). The dopant can be determined by the type (e.g., NFET, PFET) of device being formed. In various embodiments, the source/drains 150 can be heat treated to activate the dopant species.

In one or more embodiments, a portion of the vertical fin under the gate dielectric layer 120 and between the source/drains 150 can form a channel region. In other embodiments, a portion of the substrate 110 can form a channel region.

Figure 7:
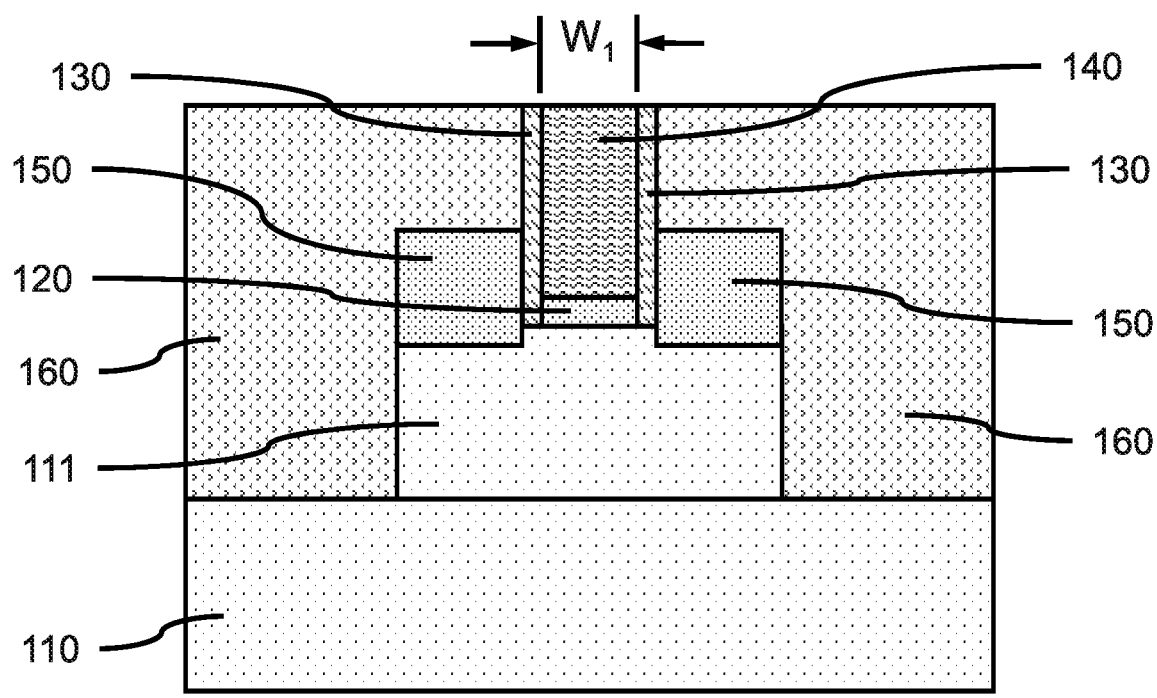
FIG. 7 is a cross-sectional side view showing the long axis of a vertical fin with a stressed layer on the sidewall surfaces of the dummy gate structure, in accordance with an embodiment of the present invention.

FIG. 7 is a cross-sectional side view showing the long axis of a vertical fin with a stressed layer on the sidewall surfaces of the dummy gate structure, in accordance with an embodiment of the present invention.

In one or more embodiments, the dummy gate fill 140 can have an initial width, $W_1$, in the range of about 15 nm to about 50 nm.

In one or more embodiments, a stressed layer 160 can be formed on the source/drains 150, exposed portions of the vertical fin(s) 111, and exposed surfaces of the gate spacer 130, where the stressed layer can have a tensile stress that can apply a lateral force to the gate spacer 130. The lateral force can pull outwardly on the sidewalls.

In one or more embodiments, the stressed layer 160 can be a silicon oxide (SiO) or silicon nitride (SiN) formed in a manner that imparts a tensile stress to the formed layer.

In one or more embodiments, the stressed layer 160 can apply a strain in the range of about 1% to about 10%, or in the range of about 2% to about 5%.

In various embodiments, the tensile stress applied by the stressed layer 160 to the sidewall surfaces of the gate spacer 130 can be balanced by the force applied to the opposite surface of the gate spacer 130 by the dummy gate fill 140, such that the gate spacer 130 remains in an upright position.

Figure 8:
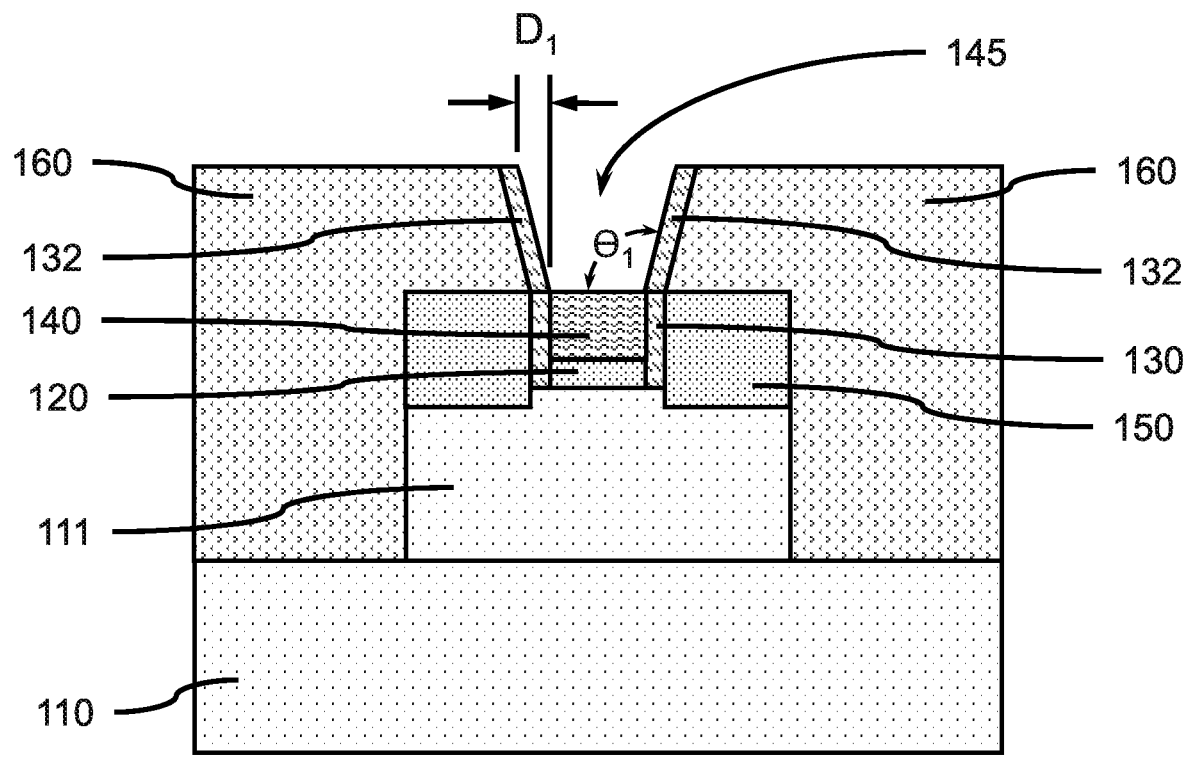
FIG. 8 is a cross-sectional side view showing the long axis of a vertical fin with a stressed layer on the canted sidewall surfaces of the dummy gate structure after removal of a portion of the dummy gate fill, in accordance with an embodiment of the present invention.

FIG. 8 is a cross-sectional side view showing the long axis of a vertical fin with a stressed layer on the canted sidewall surfaces of the dummy gate structure after removal of a portion of the dummy gate fill, in accordance with an embodiment of the present invention.

In one or more embodiments, an upper portion of the dummy gate fill 140 can be removed from within the gate spacer 130, where the dummy gate fill can be removed using a selective etch (e.g., wet chemical etch, dry plasma etch, etc.). The portion of the dummy gate fill 140 removed can extend down to the level of the top of the source/drains 150. Removal of the upper portion of the dummy gate fill 14 can eliminate the counter force balancing the tensile stress applied to the outside surfaces of the gate spacer 130.

In various embodiments, the removal of the portion of the dummy gate fill will allow the upper portion of the gate spacer 130 to lean in the direction of the stressed layer 160, thereby increasing the width of the opening at the top of the trench 145 compared with the width at the height of the top of the source/drains 150. A lower portion of the dummy gate fill 140 can remain within the gate spacer 130 at and below the level of the source/drains 150. The lower portion of the dummy gate fill 140 does not balance the stress applied to the upper portion of the gate spacer 130. In various embodiments, there can be a stretching at the end walls of the gate spacer 130 to compensate for the change in length of the gate spacer.

In one or more embodiments the distance between at the top of the inclined gate spacers 132 can increase by a distance, Di, in the range of about 1 nm to about 10 nm, or in the range of about 2 nm to about 5 nm. The gate spacer 130 can bend at an obtuse angle, $\theta_1$, relative to the top surface of the remaining lower portion of the dummy gate fill 140, where the angle, $\theta_1$, can be in the range of about 90° to about 120°, or in the range of about 95° to about 110°, or greater than 90° to about 120°.

Figure 9:
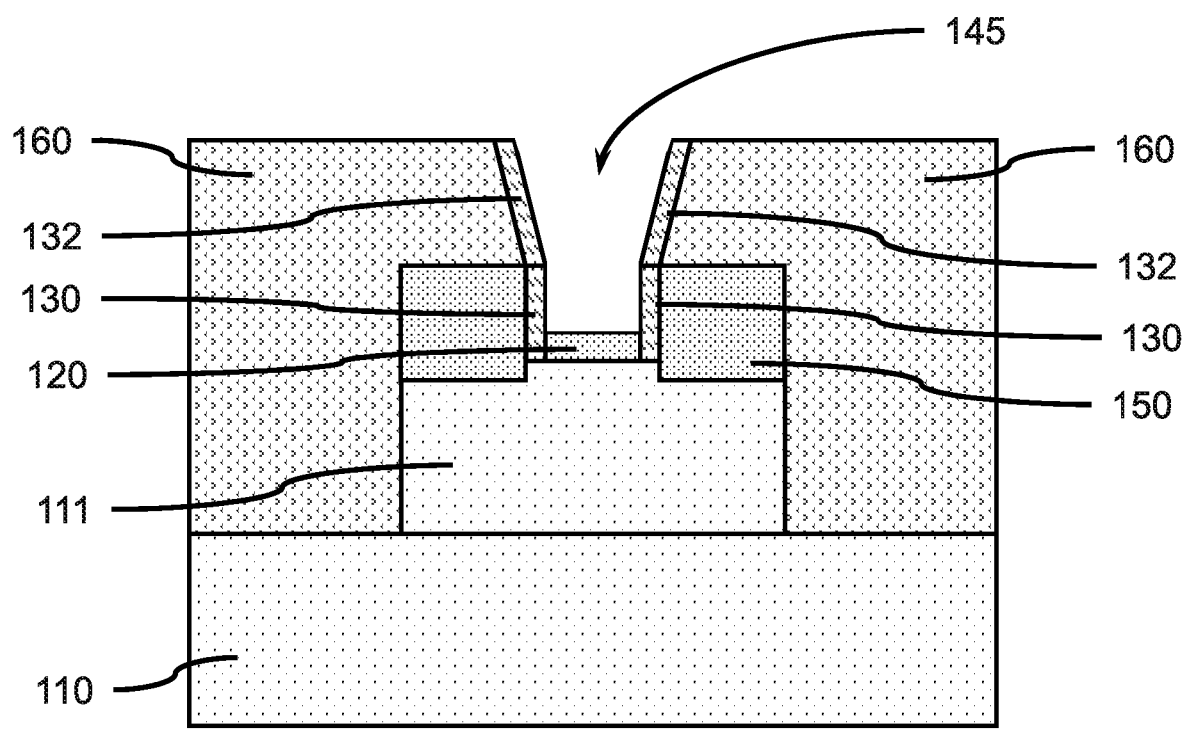
FIG. 9 is a cross-sectional side view showing the long axis of a vertical fin with a stressed layer on the canted sidewall surfaces of the dummy gate structure after removal of the remaining portion of the dummy gate fill, in accordance with an embodiment of the present invention.

FIG. 9 is a cross-sectional side view showing the long axis of a vertical fin with a stressed layer on the canted sidewall surfaces of the dummy gate structure after removal of the remaining portion of the dummy gate fill, in accordance with an embodiment of the present invention.

In one or more embodiments, the remaining portion of the dummy gate fill 140 can be removed from between the gate spacers 130, where the dummy gate fill 140 can be removed by a selective directional etch (e.g., RIE). Removal of the dummy gate fill 140 can expose the top surface of the gate dielectric layer 120 and inner sidewalls of the gate spacer 130.

Figure 10:
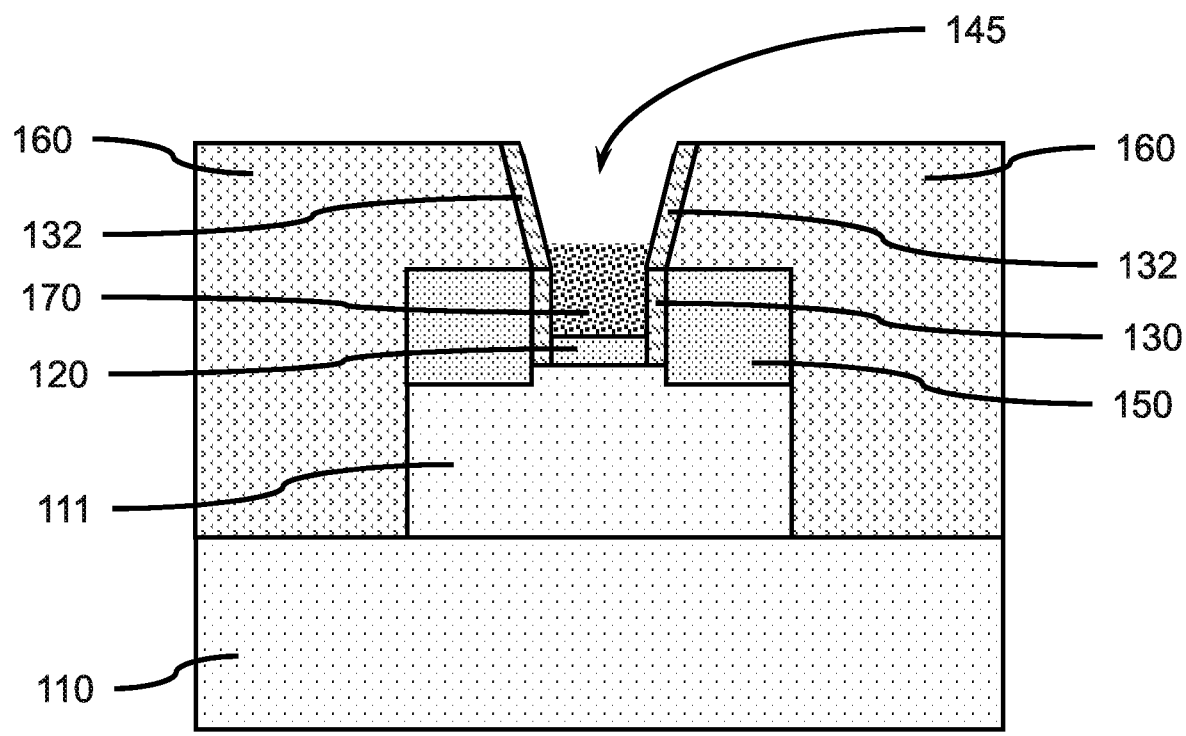
FIG. 10 is a cross-sectional side view showing the long axis of a vertical fin with a stressed layer on canted sidewall surfaces of the dummy gate structure, and a partial gate electrode fill, in accordance with an embodiment of the present invention.

FIG. 10 is a cross-sectional side view showing the long axis of a vertical fin with a stressed layer on canted sidewall surfaces of the dummy gate structure, and a partial gate electrode fill, in accordance with an embodiment of the present invention.

In one or more embodiments, a conductive gate fill 170 can be formed on the gate dielectric layer 120 and lower portion of the gate spacer 130, where the conductive gate fill 170 can fill in a portion of the trench 145. In various embodiments, the conductive gate fill 170 can fill in the trench 145 to a height above the top of the source/drains, such that at least a portion of the conductive gate fill is on the inclined portion of the gate spacers 132. An optional work function layer can be formed on the gate dielectric layer 120, before forming the conductive gate fill, where the work function layer is between the gate dielectric layer 120 and conductive gate fill 170.

In various embodiments, the conductive gate fill 170 can be deposited to a height in the range of about 30 nm to about 80 nm.

In various embodiments, a work function layer can be formed on the inner sidewalls of the gate spacer 130 and top surface of the gate dielectric layer 120, where the work function layer is between the gate dielectric layer 120 and the conductive gate fill 170. The work function layer can be formed on the sidewalls of the gate spacer 130 and top surface of the gate dielectric layer 120 by a conformal deposition, for example, by ALD, PEALD, CVD, PECVD, or combinations thereof. The work function layer and gate dielectric layer 120 can cover at least a portion of each of one or more vertical fin(s) 111 as a part of a gate structure. The work function layer can be formed on the gate dielectric layer 120 to adjust the electrical properties of a gate electrode. In various embodiments, the work function layer can be optional.

In various embodiments, a work function layer can be a conductive nitride, a conductive carbide, or combinations thereof. The work function layer can include multiple layers of work function materials, for example, a work function layer can be a TiN/TiC stack.

In various embodiments, the work function layer can have a thickness in the range of about 1 nm to about 11 nm, or can have a thickness in the range of about 3 nm to about 5 nm.

In one or more embodiments, a conductive gate fill 170 can be formed on the gate dielectric layer 120 and/or work function layer if present, where the conductive gate fill 170 can fill in the space between inner surfaces of the gate spacer 130. The conductive gate fill 170, gate dielectric layer 120, and optionally the work function layer, can form an active gate structure on one or more vertical fin(s) 111, where the conductive gate fill 170 and work function layer if present can form a conductive gate electrode.

In various embodiments, the conductive gate fill 170 can be doped polycrystalline or amorphous silicon, germanium, silicon-germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In one or more embodiments, the conductive gate fill 170 can be formed by chemical vapor deposition (CVD), atomic layer deposition (ALD), or a combination thereof.

Figure 11:
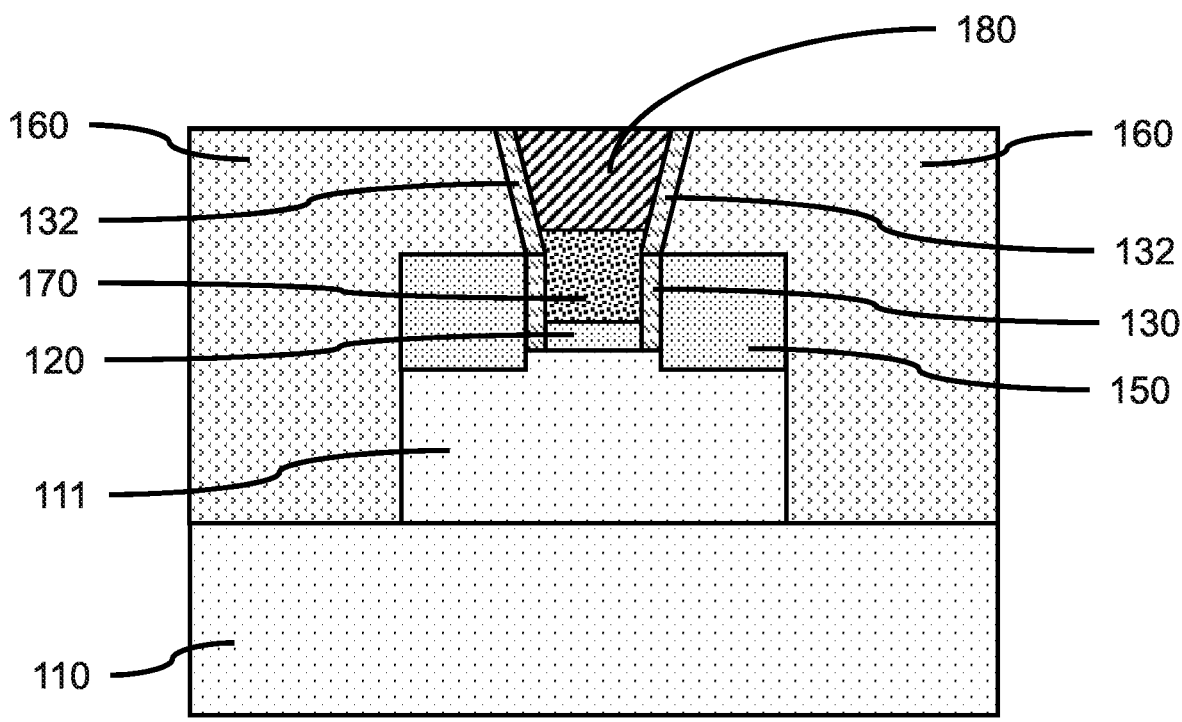
FIG. 11 is a cross-sectional side view showing the long axis of a vertical fin with a stressed plug on the partial gate electrode fill in the gate structure, in accordance with an embodiment of the present invention.

FIG. 11 is a cross-sectional side view showing the long axis of a vertical fin with a stressed plug on the partial gate electrode fill in the gate structure, in accordance with an embodiment of the present invention.

In one or more embodiments, a stressed plug 180 can be formed on the conductive gate fill 170 within the trench 145, where the stressed plug 180 can fill the remaining portion of the trench 145. In various embodiments, the stressed plug 180 can be formed by a blanket deposition, and a chemical-mechanical polishing used to remove material of the stressed plug 180 extending above the top surface of the stressed layer 160 and inclined gate spacer 132.

In various embodiments, the stressed plug 180 can have a tensile stress that applies a force to the inner surfaces of the inclined gate spacer 132.

In one or more embodiments, the stressed plug 180 can apply a strain in the range of about 2% to about 10%, or in the range of about 4% to about 8%.

In one or more embodiments, the stressed plug 180 can be silicon nitride (SiN).

Figure 12:
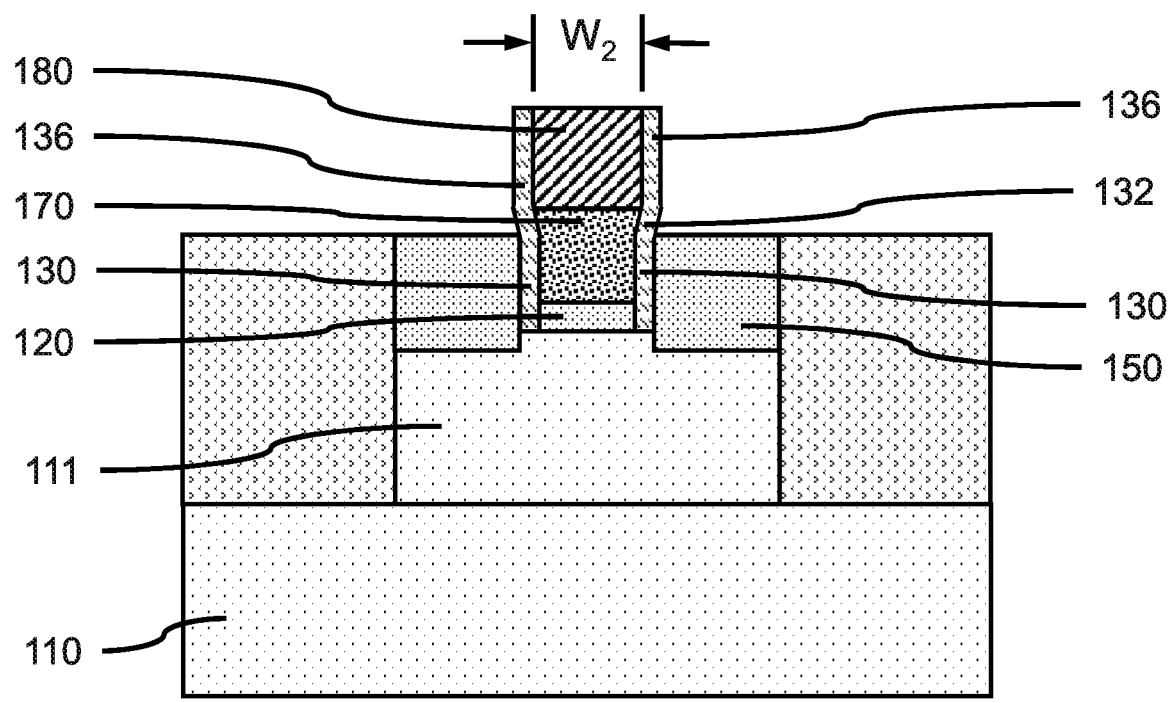
FIG. 12 is a cross-sectional side view showing the long axis of a vertical fin with straightened sidewall surfaces after removal of a portion of the stressed layer, in accordance with an embodiment of the present invention.

FIG. 12 is a cross-sectional side view showing the long axis of a vertical fin with straightened sidewall surfaces after removal of a portion of the stressed layer, in accordance with an embodiment of the present invention.

In one or more embodiments, a portion of the stressed layer 160 can be removed, for example, by a selective isotropic etch (e.g., wet chemical etch), wherein the tensile stress applied to the inner surfaces of the inclined gate spacer 132 causes the portion of the inclined gate spacer above the conductive gate fill 170 to straighten into an approximately upright position (e.g., ±5° from the normal). In various embodiments, a portion of the inclined gate spacer 132 covered by the conductive gate fill above the source/drains 120 can remain in an inclined position.

In one or more embodiments, the upper portion of the gate structure can have a greater width, $W_2$, than the initial width, $W_1$, (see FIG. 7), where the width, $W_2$, can be in the range of about 1 nm to about 7 nm greater than the initial width, $W_1$.

Figure 13:
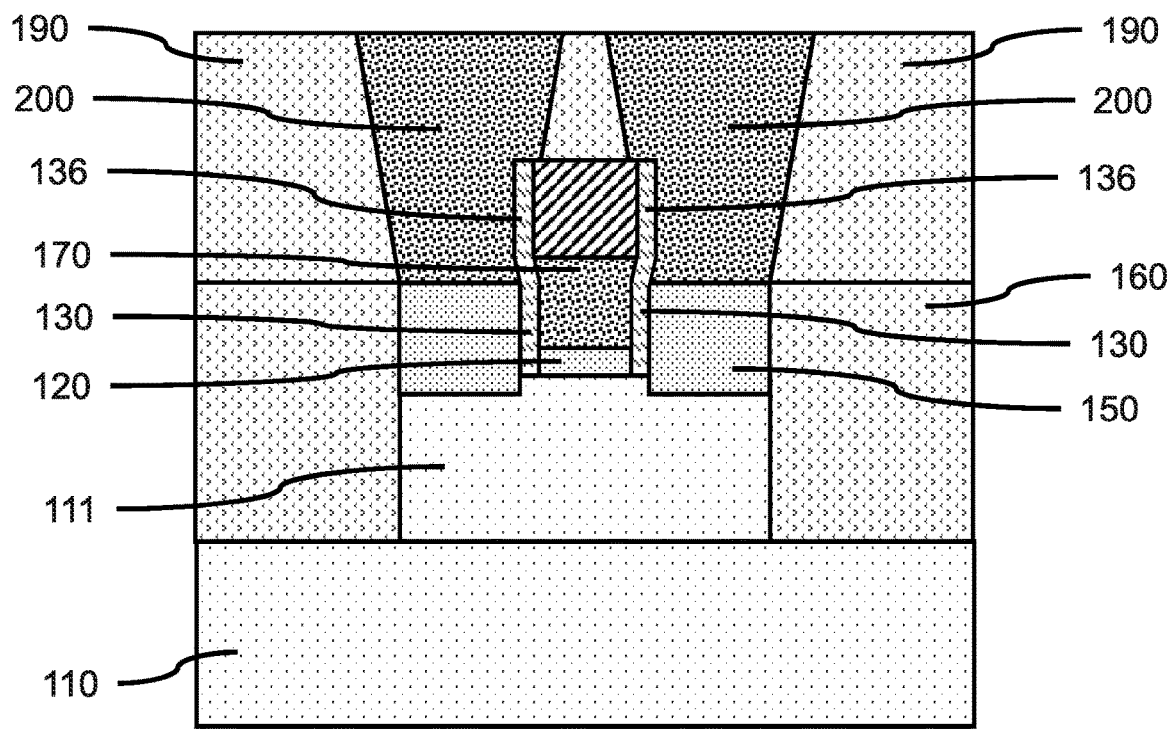
FIG. 13 is a cross-sectional side view showing the long axis of a vertical fin with electrical contacts formed to the source/drains through an interlayer dielectric layer, in accordance with an embodiment of the present invention.

FIG. 13 is a cross-sectional side view showing the long axis of a vertical fin with electrical contacts formed to the source/drains through an interlayer dielectric layer, in accordance with an embodiment of the present invention.

In one or more embodiments, an interlayer dielectric layer 190 can be formed on the stressed layer 160, straightened gate spacer 136, and stressed plug 180, where the interlayer dielectric layer 190 can be formed by a blanket deposition. The interlayer dielectric layer 190 can be a flowable oxide or polymeric material.

In one or more embodiments, openings can be formed in the interlayer dielectric layer 190 and filled with a conductive material to form electrical source/drain contacts 200 to the source/drains 150.

Figure 14:
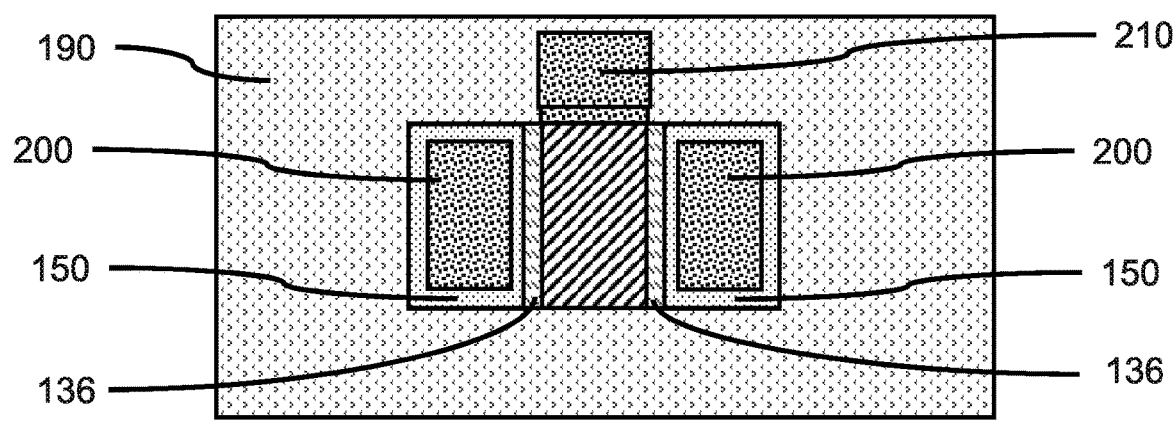
FIG. 14 is a cross-sectional top view showing electrical contacts formed to the source/drains and gate structure through an interlayer dielectric layer, in accordance with an embodiment of the present invention.

FIG. 14 is a cross-sectional top view showing electrical contacts formed to the source/drains and gate structure through an interlayer dielectric layer, in accordance with an embodiment of the present invention.

In one or more embodiments, a gate contact 210 can be formed in the interlayer dielectric layer 190 to the conductive gate fill 170 to provide an electrical connection.

Figure 15:
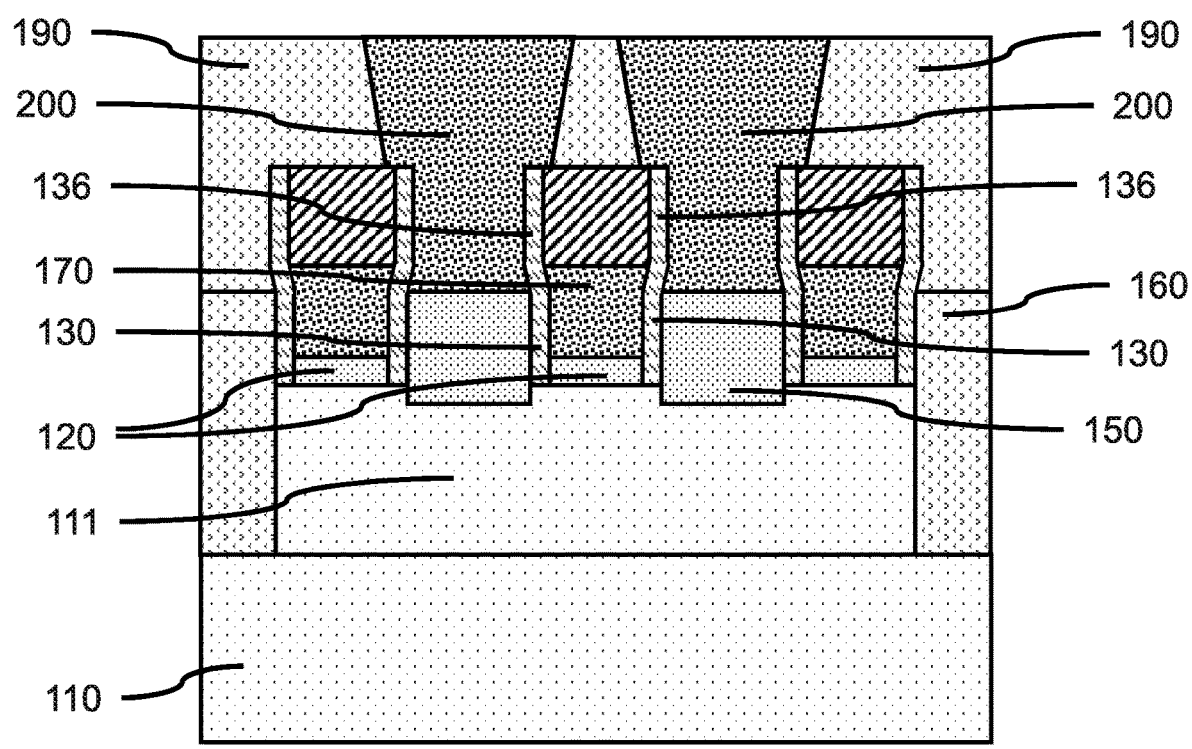
FIG. 15 is a cross-sectional side view showing three gate structures adjacent to the source/drains, in accordance with an embodiment of the present invention.

FIG. 15 is a cross-sectional side view showing three gate structures adjacent to the source/drains, in accordance with an embodiment of the present invention.

In various embodiments, the source/drain contacts 200 can extend over the adjacent stressed plugs 180, where the stressed plugs 180 and straightened gate spacers 136 electrically insulate the conductive gate fill 170 from the source/drain contacts 200.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a gate structure with a modified gate geometry, comprising:
    forming two gate spacers and a dummy gate fill, wherein the dummy gate fill is between the two gate spacers and on a gate dielectric layer;
    forming a first source/drain, wherein the first source/drain is adjacent to one of the two gate spacers and a portion of the first source/drain is above the gate dielectric layer;
    forming a stressed layer in contact with the sidewalls of the two gate spacers opposite the dummy gate fill and the portion of the first source/drain above the gate dielectric layer, and wherein the stressed layer applies a tensile stress to the two gate spacers.

2. The method of claim 1, wherein the stressed layer is silicon oxide (SiO) or silicon nitride (SiN).

3. The method of claim 1, further comprising removing a portion of the dummy gate fill, so the two gate spacers becomes inclined at an obtuse angle relative to a top surface of the remaining dummy gate fill.

4. The method of claim 3, further comprising forming a stressed plug between the two gate spacers, wherein the stressed plug applies a tensile stress to the surfaces of the two gate spacers opposite the stressed layer; and removing a portion of the stressed layer opposite the stressed plug, such that the portion of the inclined gate spacers straighten into an approximately upright position.

5. The method of claim 4, wherein the stressed plug is silicon nitride (SiN).

6. The method of claim 5, wherein each of the two gate spacers has a thickness in the range of about 3 nm to about 15 nm.

7. The method of claim 6, wherein the dummy gate fill has an initial width, W1, in a range of about 15 nm to about 50 nm between the two gate spacers.

8. The method of claim 7, further comprising forming a second source/drain on the opposite side of the dummy gate fill and two gate spacers from the first source/drain, and-forming source/drain contacts to each of the first and second source/drains.

9. The method of claim 8, wherein the source/drain contacts are in contact with the gate spacers.

* * * * *